US009786521B2

(12) United States Patent
Tan

(10) Patent No.: US 9,786,521 B2
(45) Date of Patent: Oct. 10, 2017

(54) CHIP PACKAGE METHOD FOR REDUCING CHIP LEAKAGE CURRENT

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/340,518

(22) Filed: Nov. 1, 2016

(65) Prior Publication Data

US 2017/0154793 A1    Jun. 1, 2017

(30) Foreign Application Priority Data

Nov. 27, 2015   (CN) .......................... 2015 1 0849034

(51) Int. Cl.
| | |
|---|---|
| H01L 23/538 | (2006.01) |
| H01L 21/56 | (2006.01) |
| H01L 23/495 | (2006.01) |
| H01L 23/498 | (2006.01) |
| H01L 21/683 | (2006.01) |

(52) U.S. Cl.
CPC ........ H01L 21/568 (2013.01); H01L 21/6835 (2013.01); H01L 23/49506 (2013.01); H01L 23/49548 (2013.01); H01L 23/49805 (2013.01); *H01L 2221/68318* (2013.01); *H01L 2221/68386* (2013.01); *H01L 2224/48091* (2013.01); *H01L 2224/48177* (2013.01)

(58) Field of Classification Search
CPC .......... H01L 23/5383; H01L 23/49833; H01L 23/498
See application file for complete search history.

(56) References Cited

U.S. PATENT DOCUMENTS

| | | | | |
|---|---|---|---|---|
| 6,028,354 | A | * | 2/2000 | Hoffman ............. H01L 23/3114 257/673 |
| 6,291,892 | B1 | * | 9/2001 | Yamaguchi ......... H01L 23/3121 257/676 |
| 2003/0102489 | A1 | | 6/2003 | Nam |
| 2004/0262774 | A1 | | 12/2004 | Kang et al. |
| 2005/0275061 | A1 | | 12/2005 | Ohguro |
| 2009/0039869 | A1 | | 2/2009 | Williams |
| 2011/0134613 | A1 | | 6/2011 | Moussaoui |
| 2011/0298528 | A1 | | 12/2011 | Endo et al. |
| 2012/0322202 | A1 | | 12/2012 | Nishimura |
| 2013/0299957 | A1 | | 11/2013 | Kobayashi et al. |

* cited by examiner

*Primary Examiner* — Andrew Q Tran
(74) *Attorney, Agent, or Firm* — Michael C. Stephens, Jr.

(57) ABSTRACT

A chip package method can include: forming bonding pins on a first region of a first surface of a carrier; forming an insulating layer on an inactive face of a chip, where the inactive face of the chip is opposite to an active face of the chip; pasting the chip on a second region of the first surface of the carrier by the insulating layer; electrically coupling electrodes on the active face of the chip to the bonding pins by conductive wires; forming an enclosure to cover the chip and the bonding pins by a molding process; and peeling away the carrier from the enclosure to expose the bonding pins and the insulating layer on a surface of the enclosure.

10 Claims, 5 Drawing Sheets

CHIP PACKAGE METHOD FOR REDUCING CHIP LEAKAGE CURRENT

RELATED APPLICATIONS

This application claims the benefit of Chinese Patent Application No. 201510849034.2, filed on Nov. 27, 2015, which is incorporated herein by reference in its entirety.

FIELD OF THE INVENTION

The present disclosure generally relates to the field of chip packaging, and more particularly to chip package structures and associated manufacturing methods.

BACKGROUND

Integrated circuit dice are typically packaged prior to being integrated with other electrical elements or devices in the manufacturing process. The package structure may at least provide sealing of dice, as well as provide electrical connectivity ports to external circuitry. For example, the package structure can provide electrical connectivity between dice and base board of electrical or electronic products, protection from pollution, mechanical support, heat dissipation, and also may reduce heat mechanical strain.

DETAILED DESCRIPTION

Figure 1:
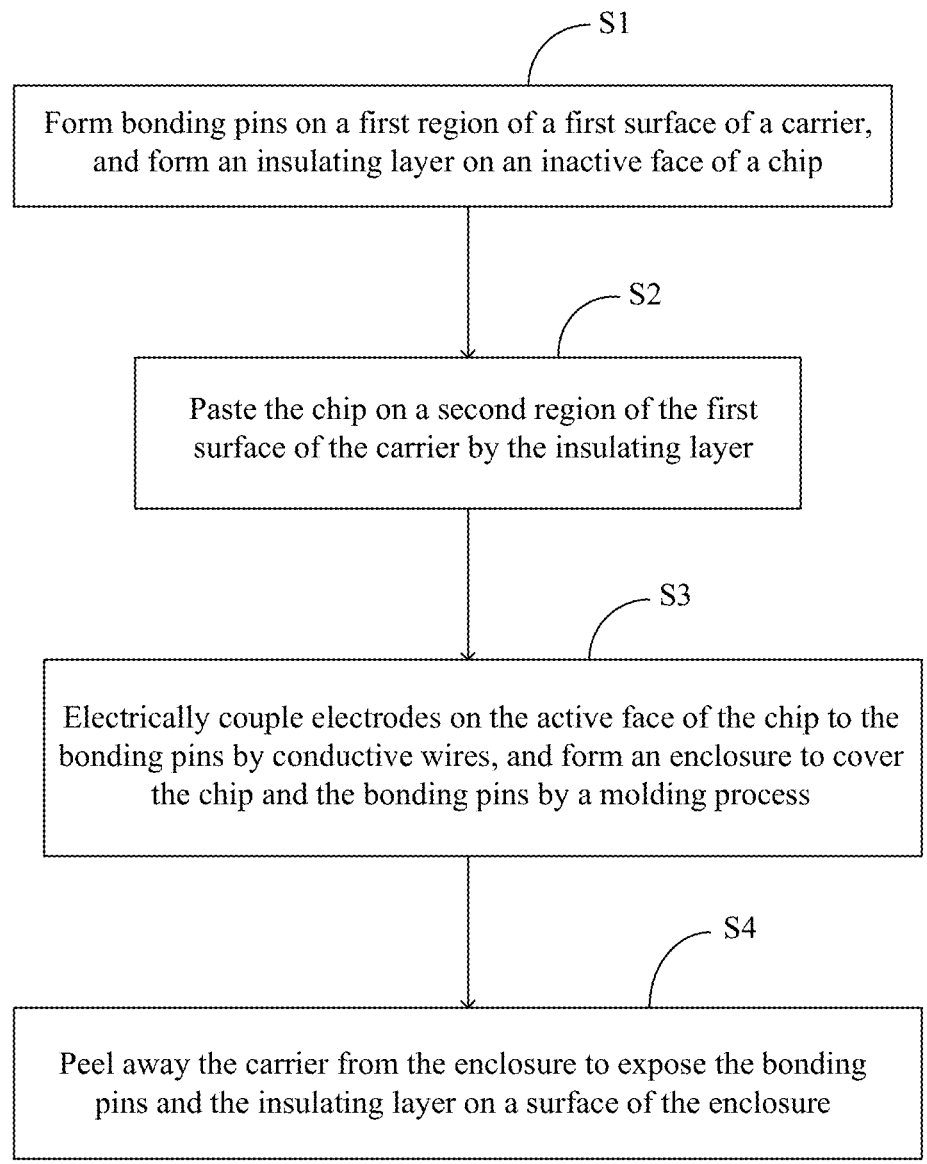
FIG. 1 is a flow diagram of an example chip packaging method, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Some chip packages are formed by dual in-line package (DIP) with relatively simplified package wiring and packaging process. However, for such dual in-line packages, the packaging efficiency may be relatively low, and the packaging size can be relatively large. This situation may adversely affect capacity improvements, such as of a memory bank, as well as possible memory frequency improvements, transmission rates, and/or circuit performance.

Surface mounted technology (SMT) is becoming an increasingly popular packaging technology in the electronic packaging industry, in order to reduce the package sizes of chips, and quad flat no-lead (QFN) packages are common in SMT. In a typical QFN package, an inactive face of a semiconductor die can be installed on middle pads of a leadframe by silver conductive paste. Also, leads of the lead frame and middle pads may be exposed on the surface of an encapsulate body through wire bonding and encapsulating. The middle pads may be exposed to facilitate heat dissipation for chips.

However, for some relatively small power devices, insulation between the inactive face and the printed-circuit board (PCB) may be more important than thermal dissipation performance because chip performance may be adversely affected by electrical leakage. Thus, a standard QFN package may not suitable for such chips/applications. In addition, as a standard QFN package may need a leadframe that is manufactured in advance, the compatibility of packages may be limited because of the fixed arrangement, interspaces, and/or sizes of leads.

In one embodiment, a chip package method can include: (i) forming bonding pins on a first region of a first surface of a carrier; (ii) forming an insulating layer on an inactive face of a chip, where the inactive face of the chip is opposite to an active face of the chip; (iii) pasting the chip on a second region of the first surface of the carrier by the insulating layer; (iv) electrically coupling electrodes on the active face of the chip to the bonding pins by conductive wires; (v) forming an enclosure to cover the chip and the bonding pins by a molding process; and (vi) peeling away the carrier from the enclosure to expose the bonding pins and the insulating layer on a surface of the enclosure.

Referring now to FIG. 1, shown is a flow diagram of an example chip packaging method, in accordance with embodiments of the present invention. In this particular example, at S1, bonding "pins" or "pads" can be formed on a first region of a first surface of a carrier. Also, an insulating layer may be formed on an inactive face of a chip. At S2, the chip can be pasted on the first region of the first surface of the carrier by the insulating layer.

At S3, electrodes on an active face of the chip can be electrically coupled to the bonding pins through conductive wires. In addition, an enclosure may be formed to cover the chip and the bonding pins by a molding process. At S4, the carrier may be peeled from the enclosure, in order to expose the bonding pins and the insulating layer on the surface of the enclosure.

Figure 2A:
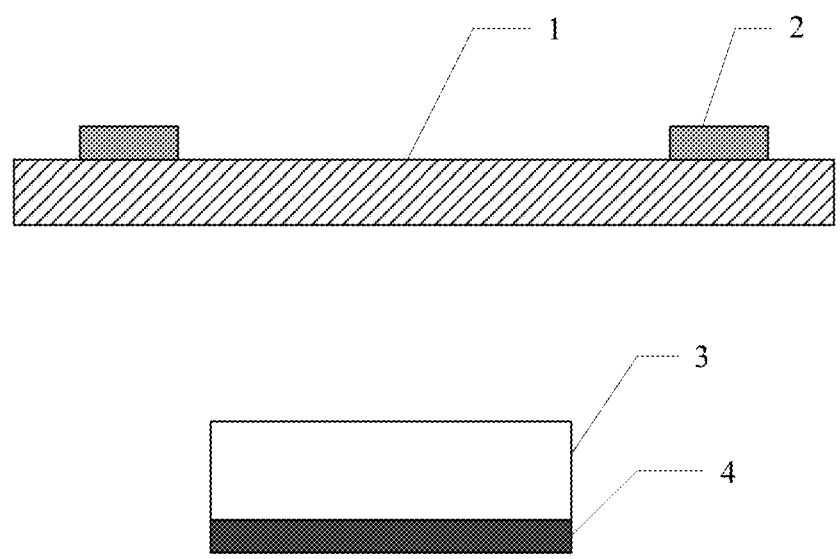
FIGS. 2A-2D are cross-sectional view diagrams of an example chip package being formed in various manufacturing stages, in accordance of embodiments of the present invention.

Referring now to FIGS. 2A-2D, shown are cross-sectional view diagrams of an example chip package being formed in various manufacturing stages, in accordance of embodiments of the present invention. In the example of FIG. 2A, step S1 from FIG. 1 may include two portions, where one is to form bonding pins 2 on the first region of the upper surface of the carrier 1, and the other is to form insulating layer 4 on the inactive face of chip 3. It should be noted that these two portions may be carried out at substantially the same time, or in a sequence.

In this example, carrier 1 can be a metal plate that is made up by a chemical element in a different group from a chemical element being used to make the bottom of bonding pins 2. This can help to guarantee the adhesion strength between carrier 1 and bonding pins 2 to be less than a predetermined value, such that bonding pins 2 can be successfully peeled from carrier 1 in step S4 of FIG. 1.

Moreover, a second region of the upper surface of carrier 1 may be planarized before bonding pins 1 are formed, such that the second region can be a substantially smooth surface. This can help to guarantee that insulating layer 4 can be successfully peeled from carrier 1 in step S4 of FIG. 1. The second region herein may refer to a region besides the first region on the upper surface of carrier 1.

In this particular example, the first region on the upper surface of carrier 1 may be around (e.g., surrounding) the second region. Since bonding pins may be formed on the first region of the upper surface of carrier 1, in order to avoid offset of bonding pins 2, the first region can be roughened before forming bonding pins 2. In addition, the extent of roughening the first region may be controlled not only to avoid offset of bonding pins 2, but also to peel bonding pins 2 from carrier 1 in step S4 of FIG. 1.

For example, one method of roughening the first region can include microetching (e.g., maskless microetching) the first region to form a trench with a predetermined depth, such as in a range of from about 0 to 5 micrometers (e.g., 3 micrometers). The depth of the trench may be used to determine the extent of roughening the first region, such that offset of the bonding pins can be avoided by controlling the depth of the trench to ensure the bonding pins can be peeled from the carrier.

For example, bonding pins 2 may be formed by plating the trench after the trench is formed. Such plating can include plating a metal layer (e.g., a metallic nickel layer) in the trench as a plating seed layer by utilizing a plating mask layer, and then plating a thick metal layer (e.g., a metallic copper layer) on the plating seed layer. In order to ensure that the bonding pins can be better locked by the encapsulate body and may not be easily fall off in step S3 of FIG. 1, the plating layer can be properly extended on the surface of the mask layer when bonding pins 2 are formed by plating. The bottom of bonding pins 2 in contact with the upper surface of carrier 1 may have a smaller cross sectional area than that of the top. This can increase the contact area between bonding pins 2 and the encapsulate body, and bonding pins may not be separated from the encapsulate body in step S4, in order to ensure package reliability.

Figure 2B:
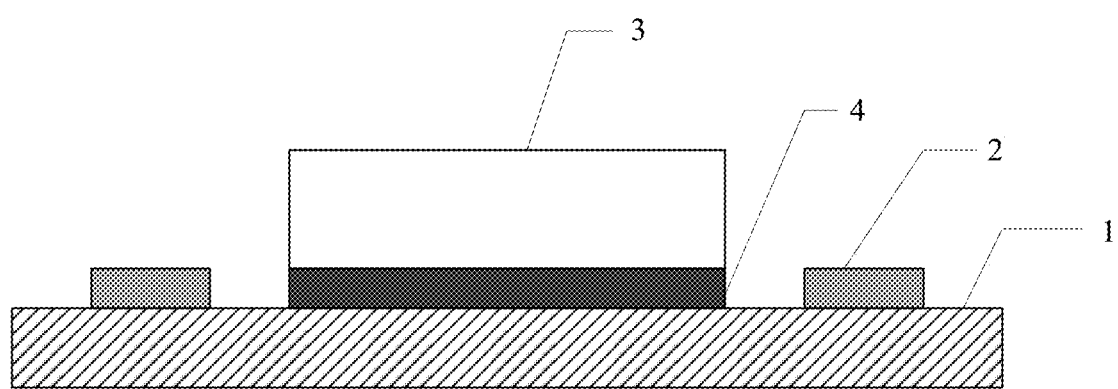

In this particular example, the method of forming insulating layer 4 on the inactive face of chip 3 may include coating insulating glue on the inactive face of chip 3 to form insulating layer 4. Then, the inactive face of chip 3 can be pasted on the second region of the upper surface of carrier 1 by the insulating glue, as shown in FIG. 2B. In this example, chip 3 may be a semiconductor die, and the inactive face can be opposite to the active face.

Figure 2C:
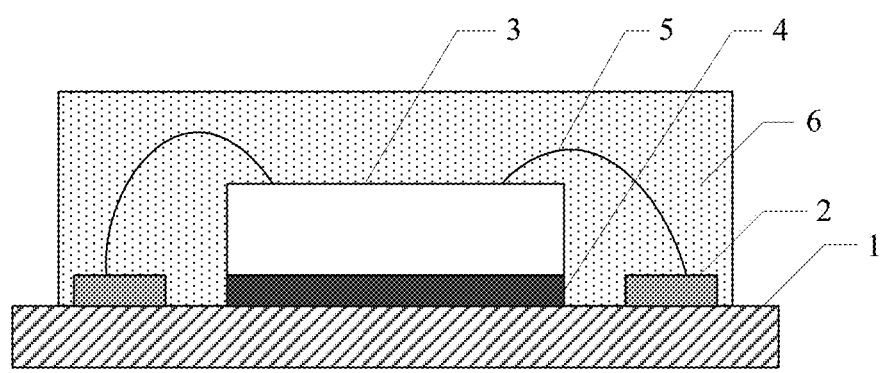

Referring now to FIG. 2C, after step S2 (of FIG. 1), electrodes on the active face of chip 3 can be electrically coupled to bonding pins 2 by conductive wires 5. Also, enclosure 6 can be formed by covering chip 3 and bonding pins 2 with a molding compound in the molding process. Then, carrier 1 may be mechanically peeled away from enclosure 6, so as to expose bonding pins 2 and insulating layer 4 on the bottom surface of encapsulate body 6, as shown in FIG. 2D.

Figure 2D:
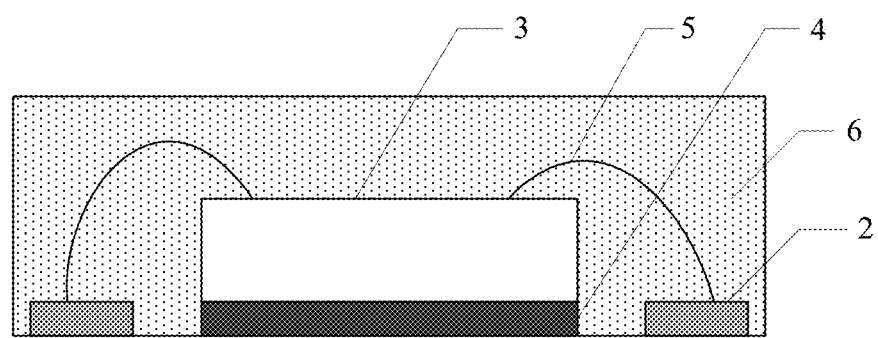

When the chip package structure of FIG. 2D is pasted on the PCB board, insulation between the inactive face of chip 3 and the PCB board can be supported as insulating layer 4 may be formed on the inactive face of chip 3. This arrangement can substantially avoid electric leakage, and may substantially guarantee appropriate electrical functionality and reliability of the package structure.

In particular embodiments, a chip package method can include forming bonding pins on the first region of the surface of the carrier, forming an insulating layer on the inactive face of the chip, and pasting the chip to the second region of the surface of the carrier by an insulating layer. The method can also include peeling away the carrier from the encapsulate body after wire bonding and an encapsulate process, so as to expose the insulating layer and the bonding pins on the surface of the encapsulate body. The package structure formed by the above described packaging method can substantially ensure insulation between the inactive face of the chip and the PCB board and suitable electrical functionality of the package structure by pasting on the PCB board. Also, the example package method can form bonding pins in the packaging process without using a leadframe formed in advance, in order to improve the compatibility of package design.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A chip package method, comprising:
   a) forming bonding pins on a first region of a first surface of a carrier;
   b) forming an insulating layer on an inactive face of a chip, wherein said inactive face of said chip is opposite to an active face of said chip;
   c) pasting said chip on a second region of said first surface of said carrier by said insulating layer;
   d) electrically coupling electrodes on said active face of said chip to said bonding pins by conductive wires;
   e) forming an enclosure to cover said chip and said bonding pins by a molding process; and
   f) peeling away said carrier from said enclosure to expose said bonding pins and said insulating layer on a second surface of said enclosure.

2. The method of claim 1, further comprising planarizing said second region before forming said bonding pins to facilitate said insulating layer being peeled from said second region when said carrier is peeled away from said enclosure.

3. The method of claim 2, further comprising roughening said first region after said planarizing of said second region in order to avoid offset of said bonding pins when forming said bonding pins on said first region, and to facilitate said bonding pins being peeled from said first region when said carrier is peeled away from said enclosure.

4. The method of claim 3, further comprising forming a trench with a predetermined depth by etching said first region in order to roughen the first surface of said first region.

5. The method of claim 4, further comprising forming said bonding pins by plating said trench.

6. The method of claim 5, wherein said trench has a depth between 0 and 5 micrometers.

7. The method of claim 1, further comprising contacting the bottom of said bonding pins with said carrier, wherein said bottom of said bonding pin has a smaller cross sectional area than a top of said bonding pin.

8. The method of claim 1, further comprising:
   a) coating insulating glue on said inactive face of said chip to form said insulating layer; and
   b) pasting said inactive face of said chip to said surface of said second region by said insulating glue.

9. The method of claim 1, further comprising mechanically peeling away said carrier from said enclosure.

10. A chip package structure formed by said chip package method of claim 1.

* * * * *